United States Patent
Kim et al.

(10) Patent No.: US 9,899,406 B2
(45) Date of Patent: Feb. 20, 2018

(54) VERTICAL NAND FLASH MEMORY DEVICE

(71) Applicant: Samsung Electronics Co., Ltd., Suwon-si (KR)

(72) Inventors: Kyoung-Hoon Kim, Seoul (KR); Hongsoo Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/992,154

(22) Filed: Jan. 11, 2016

(65) Prior Publication Data

US 2016/0343727 A1    Nov. 24, 2016

(30) Foreign Application Priority Data

May 21, 2015 (KR) .................... 10-2015-0071157

(51) Int. Cl.
| H01L 27/115 | (2017.01) |
|---|---|
| H01L 23/528 | (2006.01) |
| H01L 27/11582 | (2017.01) |
| H01L 27/11565 | (2017.01) |
| H01L 27/1157 | (2017.01) |
| H01L 27/11573 | (2017.01) |
| H01L 27/11575 | (2017.01) |

(52) U.S. Cl.
CPC .... H01L 27/11582 (2013.01); H01L 27/1157 (2013.01); H01L 27/11565 (2013.01); H01L 27/11573 (2013.01); H01L 27/11575 (2013.01)

(58) Field of Classification Search
CPC ............... H01L 23/528; H01L 27/1157; H01L 27/11578; H01L 27/11582; H01L 27/11524; H01L 27/11565; H01L 27/11573; H01L 27/11575
USPC ........................................ 257/314, 315, 324
See application file for complete search history.

(56) References Cited

U.S. PATENT DOCUMENTS

| 2007/0252201 A1* | 11/2007 | Kito .................... H01L 21/8221 257/331 |
|---|---|---|
| 2010/0213526 A1* | 8/2010 | Wada ................ H01L 21/76808 257/314 |
| 2012/0187471 A1* | 7/2012 | Yu ..................... H01L 27/11582 257/324 |

(Continued)

FOREIGN PATENT DOCUMENTS

| JP | 2010-199311 A | 9/2010 |
|---|---|---|
| KR | 10-2011-0015337 A | 2/2011 |

*Primary Examiner* — Johannes P Mondt
(74) *Attorney, Agent, or Firm* — Muir Patent Law, PLLC

(57) ABSTRACT

Provided is a vertical NAND flash memory device. The vertical NAND flash memory device may include word lines formed on a substrate, a plurality of pads horizontally extending from the word lines, and contact plugs connected to respective pads. The contact plugs may include a first contact plug connected to a lowermost pad that is closest to the substrate, and a set of second contact plugs each second contact plug connected to a corresponding pad of the plurality of pads. A first distance between the first contact plug and a second contact plug of the set of second contact plugs that is adjacent to the first contact plug may be different from second distances between adjacent contact plugs of the set of second contact plugs. The second distances may be substantially the same as each other.

14 Claims, 20 Drawing Sheets

(56) References Cited

U.S. PATENT DOCUMENTS

2014/0162420 A1* 6/2014 Oh ................... H01L 27/11565
                                                        438/270
2015/0076625 A1* 3/2015 Noguchi ............ H01L 29/4941
                                                        257/412

* cited by examiner

VERTICAL NAND FLASH MEMORY DEVICE

CROSS-REFERENCE TO RELATED APPLICATION

The present application claims priority under 35 U.S.C. § 119 to Korean Patent Application No. 10-2015-0071157 filed on May 21, 2015, in the Korean Intellectual Property Office, the entire disclosure of which is incorporated by reference herein.

BACKGROUND

Technical Field

The present disclosure relates to a vertical NAND flash memory device and a method of fabricating the same.

Description of Related Art

A vertical NAND flash memory device may include word lines having a cascade structure, and contact plugs that are connected to the respective word lines. A plurality of dummy holes may be formed at boundaries between the word lines in order to prevent a collapse of the cascade structure during a replacement process for forming the word lines. A space margin of the contact plug typically can be reduced due to the dummy holes.

SUMMARY

Some example embodiments provide a vertical NAND flash memory device in which a space margin between a contact plug connected to a lowermost word line and a dummy pillar may be improved.

Some example embodiments provide a method of fabricating the vertical NAND flash memory device.

Some example embodiments provide electronic devices including the vertical NAND flash memory device.

In accordance with certain aspects of the inventive concept, a vertical NAND flash memory device includes word lines formed on a substrate, a plurality of pads horizontally extending from the word lines, and contact plugs connected to respective pads. The contact plugs include a first contact plug connected to a lowermost pad of the plurality of pads that is closest to the substrate, and a set of second contact plugs and each second contact plug connected to a corresponding pad of the plurality of pads. A first distance between the first contact plug and a second contact plug of the set of second contact plugs that is adjacent to the first contact plug is different from second distances between adjacent second contact plugs of the set of second contact plugs. The second distances may be substantially the same as each other.

In accordance with certain aspects of the inventive concept, a vertical NAND flash memory device includes a substrate having a memory cell region and a contact connection region, word lines and interlayer insulating layers alternately and repeatedly formed on the substrate in the memory cell region, a plurality of pads disposed in the contact connection region and extended from the word lines, wherein the plurality of pads have a cascade structure, a filling insulating layer formed on the substrate in the contact connection region to cover the plurality of pads, dummy pillars passing through the filling insulating layer and boundaries between the plurality of pads and connected to the substrate, and contact plugs passing through the filling insulating layer and each contact plug connected to a corresponding pad of the plurality of pads. The contact plugs include a first contact plug connected to a lowermost pad that is closest to the substrate, and a set of second contact plugs and each second contact plug connected to a corresponding pad of the plurality of pads, and a first distance between the first contact plug and a second contact plug of the set of second contact plugs that is adjacent to the first contact plug is greater than second distances between adjacent second contact plugs of the set of second contact plugs. A third distance between the first contact plug and a dummy pillar of the dummy pillars that is adjacent to the first contact plug is greater than each of fourth distances between the each second contact plug of the set of second contact plugs and a corresponding dummy pillar of the dummy pillars that is adjacent to the each second contact plug.

In accordance with certain aspects of the inventive concept, a vertical NAND flash memory device includes a substrate having a first region and a second region, word lines and interlayer insulating layers alternately stacked on the substrate in the first region, a plurality of pads disposed in the second region and each pad extending from a corresponding word line of the word lines, a second insulating layer formed to cover the plurality of pads on the substrate in the second region, dummy pillars vertically passing through the second insulating layer and connected to the substrate, a first contact plug passing through the second insulating layer and connected to a first pad of the plurality of pads that is closest to the substrate, and a set of second contact plugs passing through the second insulating layer and each second contact plug connected to a corresponding pad of the plurality of pads. A first dummy pillar of the dummy pillars may be disposed between the first contact plug and a second contact plug of the set of second contact plugs. A first distance between the first contact plug and the first dummy pillar may be greater than a second distance between the second contact plug and the first dummy pillar.

Details of other example embodiments are included in the detailed description and drawings.

BRIEF DESCRIPTION OF THE DRAWINGS

Exemplary embodiments of the disclosure will be more clearly understood from the following detailed description taken in conjunction with the accompanying drawings.

DETAILED DESCRIPTION

Figure 1A:
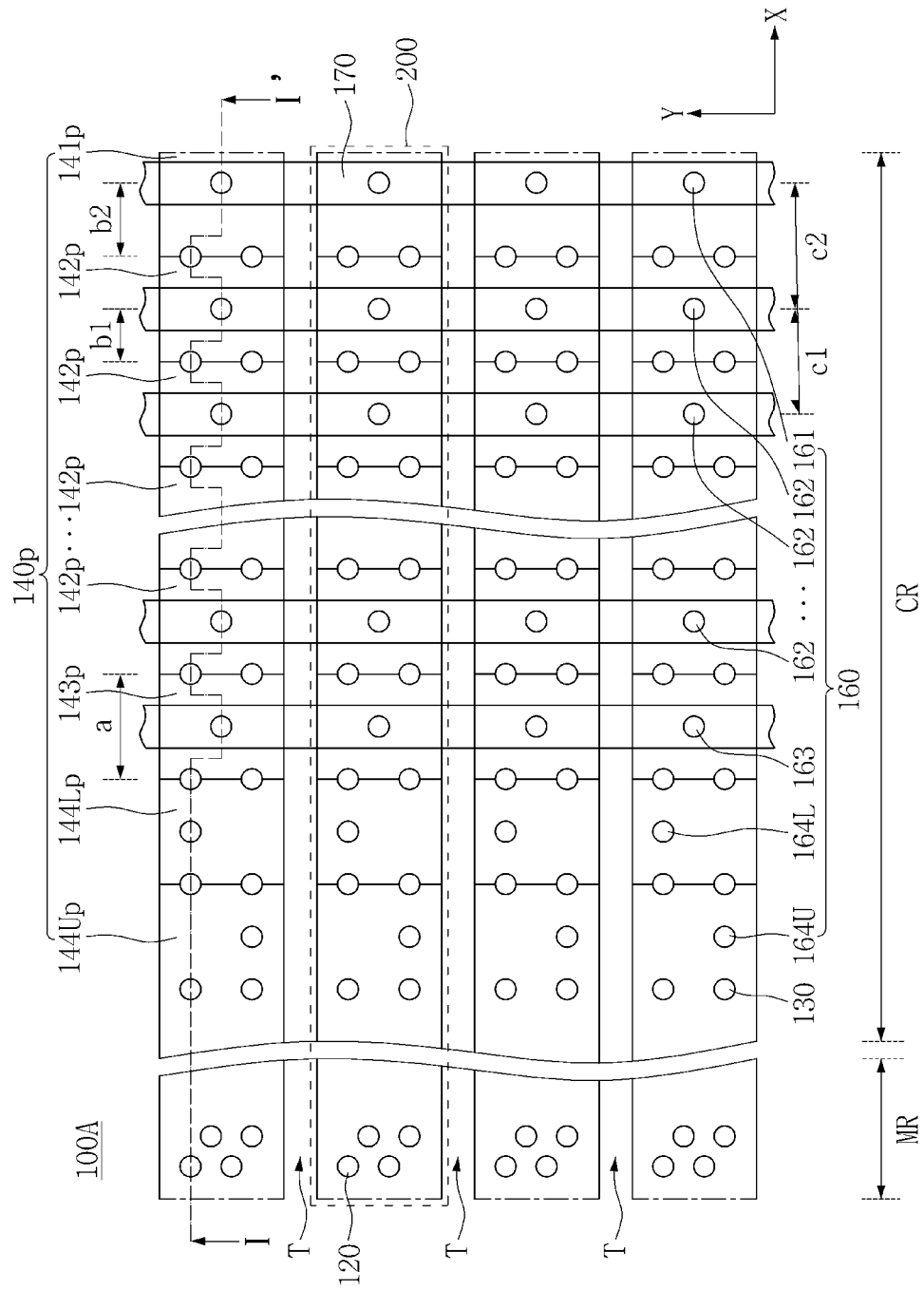
FIGS. 1A, 1B, 1C, 2A, 2B, 3 and 4 are layouts and cross-sectional views showing a vertical NAND flash memory device according to example embodiments of the inventive concepts.

Various exemplary embodiments will now be described more fully with reference to the accompanying drawings. The disclosure may, however, be embodied in different forms and should not be construed as limited to the exemplary embodiments set forth herein.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various members, regions, layers, portions, and/or elements, these members, regions, layers, portions, and/or elements should not be limited by these terms. Unless indicated otherwise, these terms are used to distinguish one member, region, portion, or element from another member, region, portion, or element. Thus, a first member, region, portion, or element discussed below could be termed a second member, region, portion, or element without departing from the teachings of exemplary embodiments. For example, a first element could be termed a second element, and, similarly, a second element could be termed a first element, without departing from the scope of exemplary embodiments.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

As used herein, a vertical NAND flash memory device may refer to various items such as a memory device, one or more logic devices or memory cells formed in or on a semiconductor substrate, a semiconductor chip, a memory chip, a memory die, a package including one or memory chips and optionally one or more logic chips, or combinations thereof. A vertical NAND flash memory device such as a semiconductor chip, a memory chip, or a logic chip may be formed from a wafer. A vertical NAND flash memory device may comprise a package which may include one or more chips stacked on a package substrate, or a package-on-package device including a plurality of packages. A vertical NAND flash memory device may include one or more transistors such as metal oxide semiconductor field effect transistors (MOSFETs) or fin field effect transistors (FinFETs), or an array of memory cells.

An electronic device, as used herein, may refer to one of these devices and may also include products that include these devices, such as a memory card, a memory module, a hard drive including additional components, a mobile phone, laptop, tablet, desktop, camera, server, or other consumer electronic device.

Figure 1B:
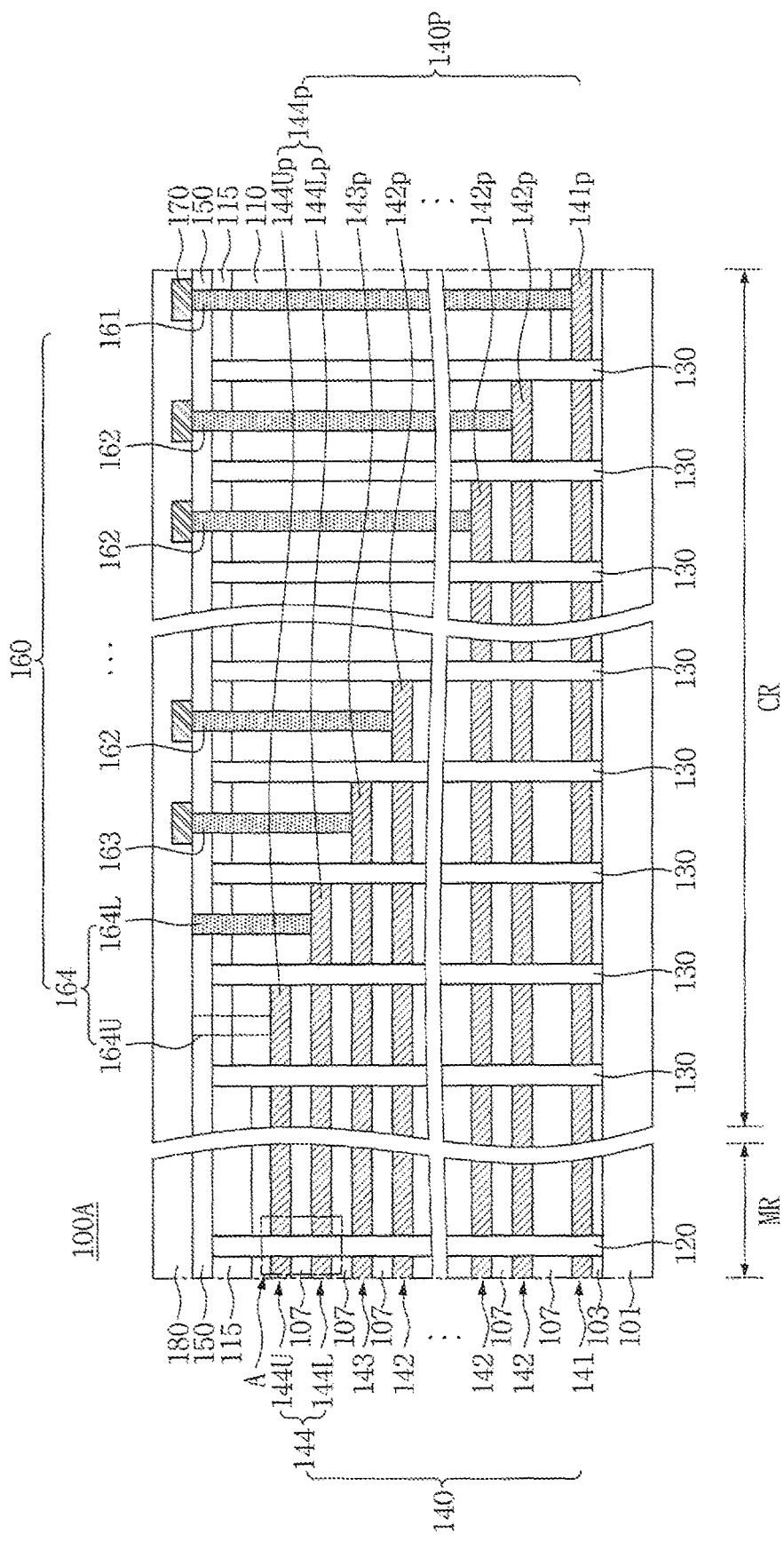
Figure 1C:
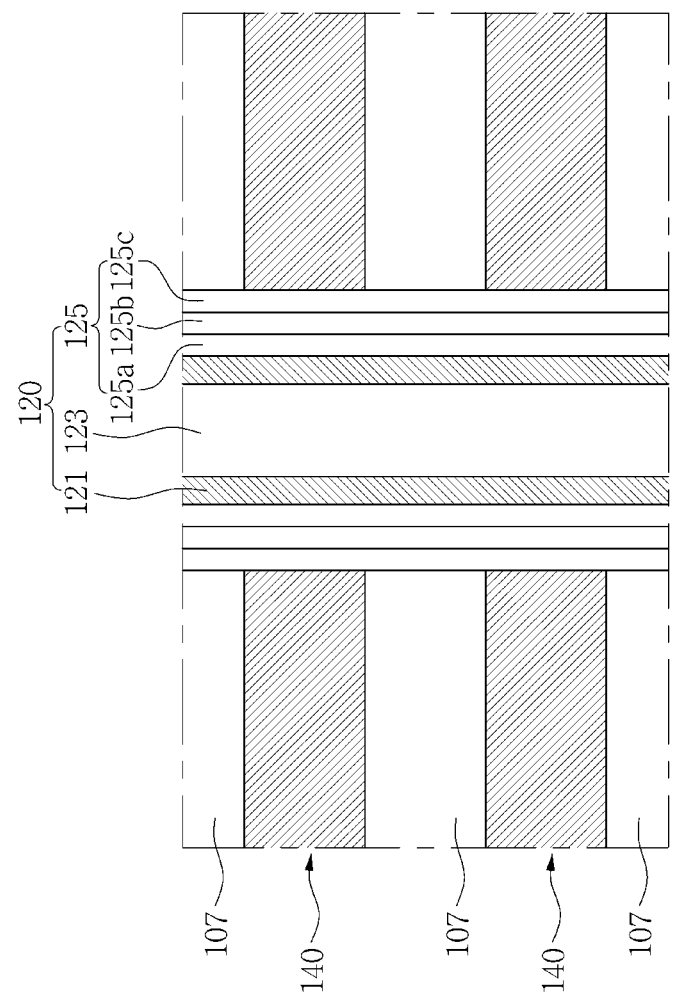

FIG. 1A is a layout illustrating a vertical NAND flash memory device according to example embodiments of the inventive concept, FIG. 1B is a cross-sectional view taken along line I-I' of FIG. 1A, and FIG. 1C is an enlarged view of a portion "A" of FIG. 1B.

Referring to FIGS. 1A and 1B, a vertical NAND flash memory device 100A according to example embodiments of the inventive concept may include a substrate 101 having a memory cell region MR and contact connection region CR. For example, the vertical NAND flash memory device 100A may include a plurality of blocks 200 spaced apart from each other by trenches "T" in the Y-direction. Hereinafter, each of the plurality of blocks 200 may be referred to as a "plane structure." Thus, FIG. 1B is a cross-sectional view taken along line I-I' of one of the plane structures 200 of FIG. 1A. The vertical NAND flash memory device 100A may include multi-layer word lines 140, vertical channel structures 120, pads 140p, filling insulating layer 110, dummy pillars 130, contact plugs 160, and input/output (I/O) metal lines 170. The multi-layer word lines 140 and the vertical channel structures 120 may be formed in the memory cell region MR on the substrate 101. The pads 140p, the filling insulating layer 110, the dummy pillars 130, the contact plugs 160, and the I/O metal lines 170 may be formed in the contact connection region CR. Also, the vertical NAND flash memory device 100A may further include a buffer insulating layer 103, interlayer insulating layers 107, a first upper interlayer insulating layer 115, a second upper interlayer insulating layer 150, and a third upper interlayer insulating layer 180. The buffer insulating layer 103, the interlayer insulating layers 107, the first upper interlayer insulating layer 115, the second upper interlayer insulating layer 150, and the third upper interlayer insulating layer 180 may be formed in the memory cell region MR and contact connection region CR in common.

In example embodiments, each of the plane structures 200 may include four channel structures 120, two string select lines, n cell gate lines, and a ground select line. The n may be a natural number greater than 2. Thus, one of the four channel structures 120 may be selected when the vertical NAND flash memory device 100A is operated.

The substrate 101 may be a semiconductor substrate. For example, the substrate 101 may include a silicon wafer, an epitaxial growth silicon germanium (SiGe) wafer, or a silicon-on-insulator (SOI) wafer.

The word lines 140 may be electrically separated from each other by the interlayer insulating layers 107. The word lines 140 may include a metal material such as tungsten (W), copper (Cu), or a metal silicide. The word lines 140 may horizontally extend from the memory cell region MR to the contact connection region CR. In example embodiments, the word lines 140 that are located in the contact connection region CR may be used as the pads 140p.

The word lines 140 may include a lowermost ground select line 141 that is the closest to the substrate 101, intermediate cell gate lines 142 disposed above the ground select line 141, a dummy word line 143 disposed above the cell gate lines 142, and string select lines 144 disposed above the dummy word line 143. The string select lines 144 may include a lower string select line 144L and an upper string select line 144U. In another embodiment, the ground select line 141 may be a multi-layer. Further, in another embodiment, the string select lines 144 may be a single-layer.

A vertical thickness of the ground select line 141, vertical thicknesses of the cell gate lines 142, a vertical thickness of the dummy word line 143, and vertical thicknesses of the string select lines 144 may be substantially the same. In other embodiment, the vertical thicknesses of the ground select line 141 and the string select line 144 may be greater than the vertical thicknesses of the cell gate lines 142.

The vertical channel structures 120 may be in contact with the substrate 101 by vertically passing through the first upper interlayer insulating layer 115, the interlayer insulating layers 107, the word lines 140, and the buffer insulating layer 103. Referring to FIG. 1A, the vertical channel structures 120 may be disposed in a zigzag shape in a plan view.

Referring to FIG. 1C, the vertical channel structures 120 may include, for example, channel layers 121, core layers 123, and dielectric layers 125.

The channel layers 121 may have a pipe shape. The channel layers 121 may include polysilicon.

The core layers 123 may be formed to fill insides of the channel layers 121 having the pipe shape. The core layers 123 may include silicon oxide.

The dielectric layers 125 may be formed between the word lines 140 and the channel layers 121. The dielectric layers 125 may include tunnel insulating layers 125a, charge trap layers 125b, and blocking insulating layers 125c. The tunnel insulating layers 125a may be adjacent to the channel layers 121. The blocking insulating layers 125c may be adjacent to the word lines 140. The charge trap layers 125b may be disposed between the tunnel insulating layers 125a and the blocking insulating layers 125c. The tunnel insulating layers 125a may include silicon oxide, silicon nitride, or silicon oxynitride. The charge trap layers 125b may include silicon nitride. The blocking insulating layers 125c may include an insulating material having a higher dielectric constant than the tunnel insulating layers 125a.

In example embodiments, the vertical channel structure 120 may include string select transistors, cell transistors, and a ground select transistor connected to each other in series. The string select lines 144 may be connected to the string select transistors, each of the cell gate lines 142 may be connected to respective cell transistors, and the ground select line 141 may be connected to the ground select transistor.

The pads 140p may be electrically separated from each other by the interlayer insulating layers 107. The pads 140p may include a metal material such as tungsten (W), copper (Cu), or a metal silicide. The pads 140p may be materially in continuity with the word lines 140.

The pads 140p may have a cascade structure. Horizontal lengths of the pads 140p may be greater as the pads 140p are closer to the substrate 101. For example, horizontal length of a lowermost pad 140p that is the closest to the substrate 101 of the pads 140p may be the greatest, and horizontal length of an uppermost pad 140p that is farthest from the substrate 101 of the pads 140p may be the smallest.

The pads 140p may include a lowermost ground select pad 141p that is the closest to the substrate 101, cell gate pads 142p disposed above the ground select pad 141p, a dummy pad 143p disposed above the cell gate pads 142p, and string select pads 144p disposed above the dummy pad 143p. The string select pads 144p may include a lower string select pad 144Lp disposed above the dummy pad 143p, and an upper string select pad 144Up disposed above the lower string select pad 144Lp. In another embodiment, the ground select pad 141p may be a multi-layer. Further, in another embodiment, the string select pads 144p may be a single-layer.

During a manufacturing memory device, surface of a part of the cell gate pads 142p, the dummy pad 143p, the string select pads 144p may be exposed, and a surface of the ground select pad 141p may not be exposed. For example, the ground select pad 141p may be covered by a lowermost interlayer insulating layer 107 of the interlayer insulating layers 107.

The filling insulating layer 110 may be formed to cover the pads 140p in the contact connection region CR. The filling insulating layer 110 may include at least one of, for example, high density plasma (HDP) oxide, tetra-ethyl-ortho-silicate (TEOS), plasma enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin-on-glass (SOG), tonen silazene (TOSZ), or a combination thereof.

The dummy pillars 130 may be in contact with the substrate 101 by vertically passing through the first upper interlayer insulating layer 115, the interlayer insulating layers 107, the filling insulating layer 110, and the buffer insulating layer 103.

In example embodiments, the dummy pillars 130 may be disposed on boundaries between the adjacent pads 140p. For example, the dummy pillars 130 may be disposed to contact the end side also referred to as an edge or a terminal end, of each of the pads 140p.

In example embodiments, referring to FIG. 1A, for each plane structure 200, two dummy pillars 130 may be disposed to be separated in a Y direction on a boundary between two pads 140p. In example embodiments, for each plane structure 200, only one dummy pillar 130 is disposed at a boundary between two pads 140p. Each of the dummy pillars 130 may vertically pass through the end side of a corresponding pad of the plurality of pads and contact the edge of the corresponding pad. The dummy pillars 130 (e.g., between two adjacent dummy pillars 130 at the same Y-direction location) may be disposed parallel to each other in an X direction. The X direction distances "a" between the dummy pillars 130 may be substantially the same. In example embodiments, the dummy pillars 130 may have substantially the same structure as the vertical channel structures 120 of FIG. 1C. In example embodiments, the dummy pillars 130 may include only silicon oxide.

The contact plugs 160 may be in contact with the pads 140p by passing through the second upper interlayer insulating layer 150, the first upper interlayer insulating layer 115, and the filling insulating layer 110. The contact plugs 160 may include a ground select contact plug 161, cell gate contact plugs 162, a dummy contact plug 163, and string select contact plugs 164. The string select contact plugs 164 may include a lower string select contact plug 164L and an upper string select contact plug 164U. The upper string select contact plug 164U is shown as the imaginary dotted line in FIG. 1B. In example embodiments, the dummy contact plug (e.g., 163) is not included. In example embodiments, the contact plugs 160 may include an additional ground select contact plug 161.

The ground select contact plug 161 may be in contact with the ground select pad 141p. The cell gate contact plugs 162 may be in contact with the cell gate pads 142p. The dummy contact plug 163 may be in contact with the dummy pad 143p. The string select contact plugs 164 may be in contact with the string select pads 144p. As described above, since the ground select pad 141p is covered by the lowermost interlayer insulating layer 107, the ground select contact plug 161 may be in contact with the ground select pad 141p by further passing through the lowermost interlayer insulating layer 107.

Since the ground select contact plug 161 is in contact with the lowermost ground select pad 141p that is the closest to the substrate 101, a vertical length of the ground select contact plug 161 may be greater than vertical lengths of the cell gate contact plugs 162, the dummy contact plug 163, and the string select contact plug 164.

Further, since the horizontal lengths of the pads 140p are smaller as the pads 140p are further away from the substrate 101, the vertical lengths of the contact plugs 160 may be smaller as the contact plugs 160 are closer to the memory cell region MR.

Referring to FIG. 1A, first distances c1 between adjacent cell gate contact plugs 162 may be substantially the same. Each of the first distances c1 may refer to a distance between center portions of adjacent cell gate contact plugs 162 in the X direction. Also, a second distance c2 between a lowermost cell gate contact plug 162 of the cell gate contact plugs 162 and the ground select contact plug 161 may be different from the first distances c1. For example, the second distance c2 may be greater than each of the first distances c1. The second distance c2 may refer to a distance between a center portion of the lowermost cell gate contact plugs 162 and a center portion of the ground select contact plug 161 in the X-direction. For example, each of the first distances c1 may be minimized and substantially the same as each other for reducing the area of the vertical NAND flash memory device 100A.

In example embodiments, a distance b1 from a boundary between a lowermost cell gate pad 142p of the cell gate pads 142p and a first cell gate pad 142p that is disposed above the lowermost cell gate pad 142p to the center portion of the lowermost cell gate contact plug 162 that is connected to the lowermost cell gate pad 142p may be smaller than a distance b2 from a boundary between the ground select pad 141p and the lowermost cell gate pad 142p to the center portion of the ground select contact plug 161. In example embodiments, each of distances b1 between adjacent dummy pillar 130 and cell gate contact plug 162 may be minimized and substantially the same as each other for reducing the area of the vertical NAND flash memory device 100A.

In example embodiments, referring to FIG. 1A, the cell gate contact plugs 162 may be consecutively disposed at a distance of first distances c1 apart from each other in the X-direction. In addition, the cell gate contact plugs 162 and dummy pillars 130 may be alternately arranged in the X-direction at a distance of b1 apart from each other. The ground select contact plug 161 may be disposed at a position spaced apart from an adjacent cell gate contact plug 162 in the X-direction by the second distance c2 in the X direction. In addition, the ground select contact plug 161 may be disposed at a position spaced apart from an adjacent dummy pillar 130 in the X-direction by the distance of b2 in the X direction.

The I/O metal lines 170 may be formed on the second upper interlayer insulating layer 150 to be in contact and aligned with the cell gate contact plugs 162, the dummy contact plug 163, and the ground select contact plug 161. Referring to FIG. 1A, the I/O metal lines 170 may extend parallel to each other in the Y direction. For example, a first I/O metal line 170 may be connected to first pads 140p of a first set of plane structures 200 and a second I/O metal line 170 may be connected to second pads 140p of a second set of plane structures 200. For example, the first pads 140p may be lowermost ground select pads 141p of the first set of plane structures 200 and the second pads 140p may be lowermost cell gate pads 142p of the second set of plane structures 200. A number of the first or second set of plane structures 200 may be 2n, n is a natural number grater than 1.

The buffer insulating layer 103 may be formed on the substrate 101. The buffer insulating layer 103 may be formed in both the memory cell region MR and the contact connection region CR. The buffer insulating layer 103 may include, for example, silicon oxide. A vertical thickness the buffer insulating layer 103 may be smaller than vertical thicknesses of the interlayer insulating layers 107.

The interlayer insulating layer 107 may be formed between the word lines 140. The interlayer insulating layer 107 may be formed in both the memory cell region MR and the contact connection region CR. The interlayer insulating layers 107 that are disposed in the contact connection region CR may have a cascade structure. A vertical thickness of a lowermost interlayer insulating layer 107 of the interlayer insulating layers 107 may be greater than vertical thicknesses of the other interlayer insulating layers 107. The interlayer insulating layers 107 may include, for example, silicon oxide.

The first upper interlayer insulating layer 115 may be formed to surround portions of side surfaces of the vertical channel structures 120, portions of side surfaces of the dummy pillars 130, and portions of side surfaces of the contact plugs 160 on the interlayer insulating layers 107 and the filling insulating layer 110. An upper surface of the first upper interlayer insulating layer 115 may be substantially coplanar with upper surfaces of the vertical channel structures 120, and upper surfaces of the dummy pillars 130. The first upper interlayer insulating layer 115 may be formed in both the memory cell region MR and the contact connection region CR. A vertical thickness of the first upper interlayer insulating layer 115 that is disposed in the memory cell region MR may be greater than a vertical thickness of the first upper interlayer insulating layer 115 that is disposed in the contact connection region CR.

The second upper interlayer insulating layer 150 may be formed to surround portions of side surfaces of the contact plugs 160 on the first upper interlayer insulating layer 115. An upper surface of the second upper interlayer insulating layer 150 may be substantially coplanar with upper surfaces of the contact plugs 160.

The third upper interlayer insulating layer 180 may be formed to cover the I/O metal lines 170 on the second upper interlayer insulating layer 150.

The first upper interlayer insulating layer 115, the second upper interlayer insulating layer 150, and the third upper interlayer insulating layer 180 may include at least one of HDP oxide, TEOS, PE-TEOS, $O_3$-TEOS, USG, PSG, BSG, BPSG, FSG, SOG, TOSZ, or a combination thereof.

The vertical NAND flash memory device 100A according to example embodiments of the inventive concept has been described above. In the vertical NAND flash memory device 100A according to example embodiments of the inventive concept, a distance between a ground select contact plug and a cell gate contact plug that is adjacent to the ground select contact plug (e.g., in the X-direction) may be greater than distances between adjacent ones of the cell gate contact plugs (e.g., in the same X-direction). As a result, a space margin between the ground select contact plug and a dummy pillar that is adjacent to the ground select contact plug can be improved.

As described above, since the space margin between the ground select contact plug having the longest vertical length and a dummy pillar that is adjacent to the ground select contact plug may be improved, when a not-open defect occurs in a process of forming a contact hole for forming the ground select contact plug, it is possible to easily perform an additional etching process.

Figure 2A:
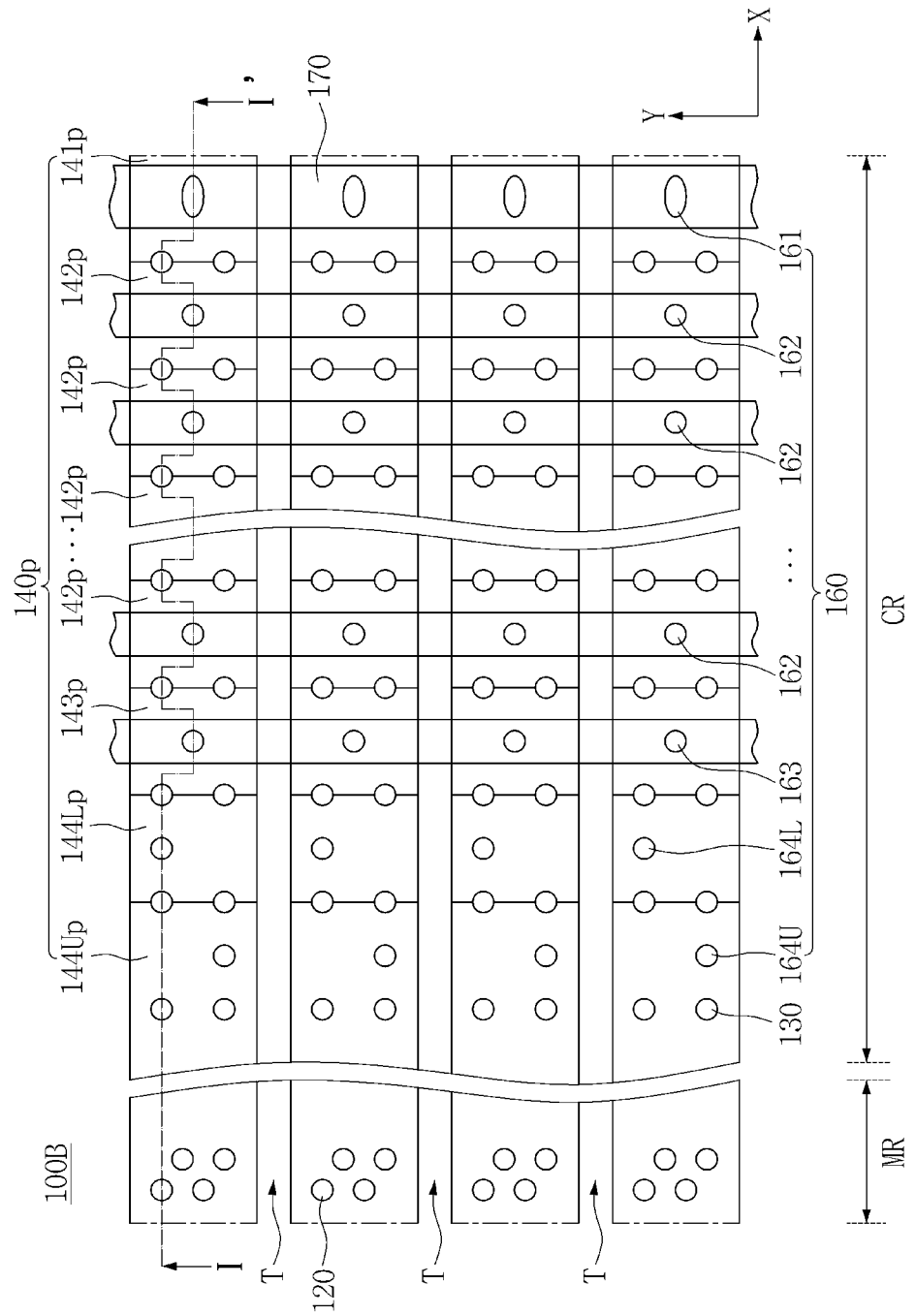
Figure 2B:
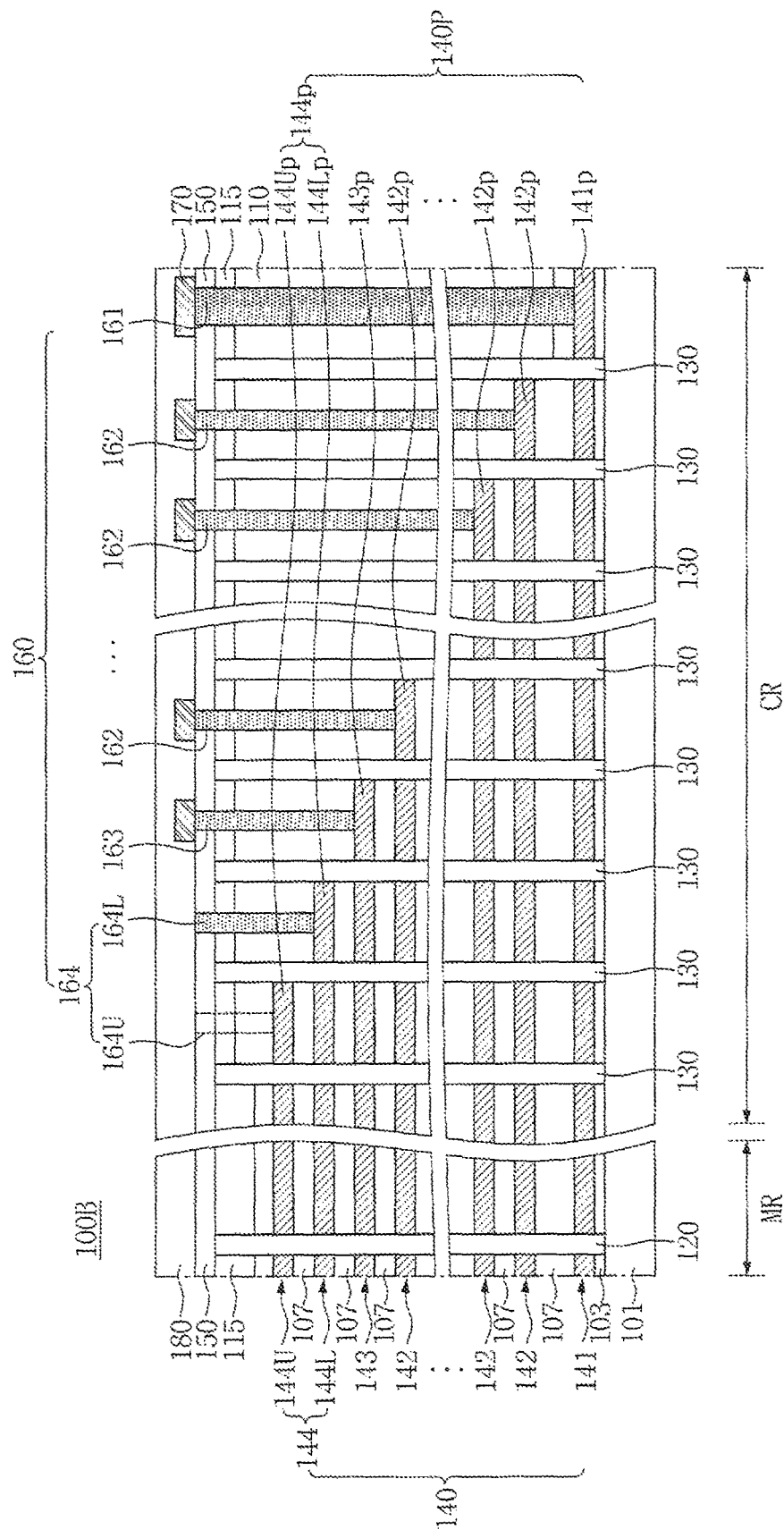

FIG. 2A is a layout illustrating a vertical NAND flash memory device according to example embodiments of the inventive concept, FIG. 2B is a cross-sectional view taken along line I-I' of FIG. 2A. In the embodiment of the inventive concept, detailed descriptions of the same contents as those of the above-described embodiments will be omitted.

Referring to FIGS. 2A and 2B, a vertical NAND flash memory device 100B in accordance with the embodiment of the inventive concept may include a ground select contact plug 161 having an upper surface in a different shape from upper surfaces of cell gate contact plugs 162 in a plan view, compared to the vertical NAND flash memory device 100A in FIGS. 1A and 1B. For example, each upper surface of the cell gate contact plugs 162 may have a circle shape in which a width of the X-direction and a width of Y-direction are substantially the same. For example, a circle shape or a square shape, in which a width of the X-direction and a width of Y-direction are substantially the same, may be referred to as a first type of shape (e.g., an equilateral or circular shape). The ground select contact plug 161 may have an elliptical shape in which a width of the X-direction and a width of Y-direction are different from each other. For example, an elliptical shape or a rectangle shape, in which a width of the X-direction and a width of Y-direction are different from each other, may be referred to as a second type of shape (e.g., an elongated shape). As shown in FIG. 2A, the width of the X-direction of the ground select contact plug 161 may be greater than the width of the Y-direction of the ground select contact plug 161. In certain embodiments, the ground select contact plug 161 may have an elliptical shape elongated in the X-direction in a plan view. As a result, a situation where the not-open defect occurs in a process of forming a contact hole for forming the ground select contact plug 161 may be reduced by increasing an area of the ground select contact plug 161.

Figure 3:
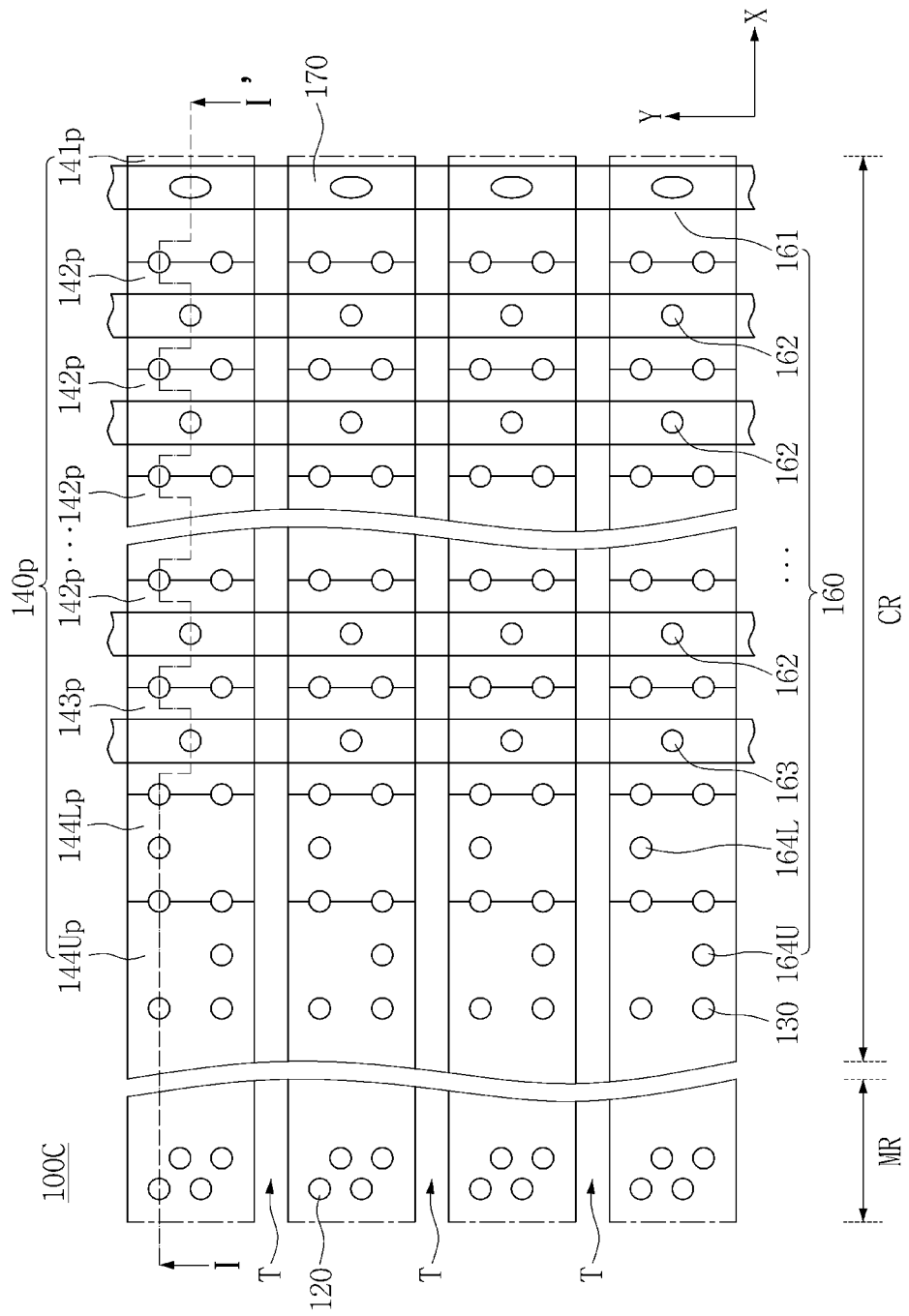

FIG. 3 is a layout illustrating a vertical NAND flash memory device according to example embodiments of the inventive concept. In the embodiment of the inventive concept, detailed descriptions of the same contents as those of the above-described embodiments will be omitted.

Referring to FIG. 3, a vertical NAND flash memory device 100C in accordance with the embodiment of the inventive concept may include a ground select contact plug 161 in which a width of the Y-direction is greater than a width of the X-direction in a plan view, compared to the vertical NAND flash memory device 100B in FIG. 2A. In certain embodiments, the ground select contact plug 161 may have an elliptical shape elongated in the Y-direction in a plan view. A cross-sectional view taken along line I-I' of FIG. 3 may be the same as FIG. 1B.

Figure 4:
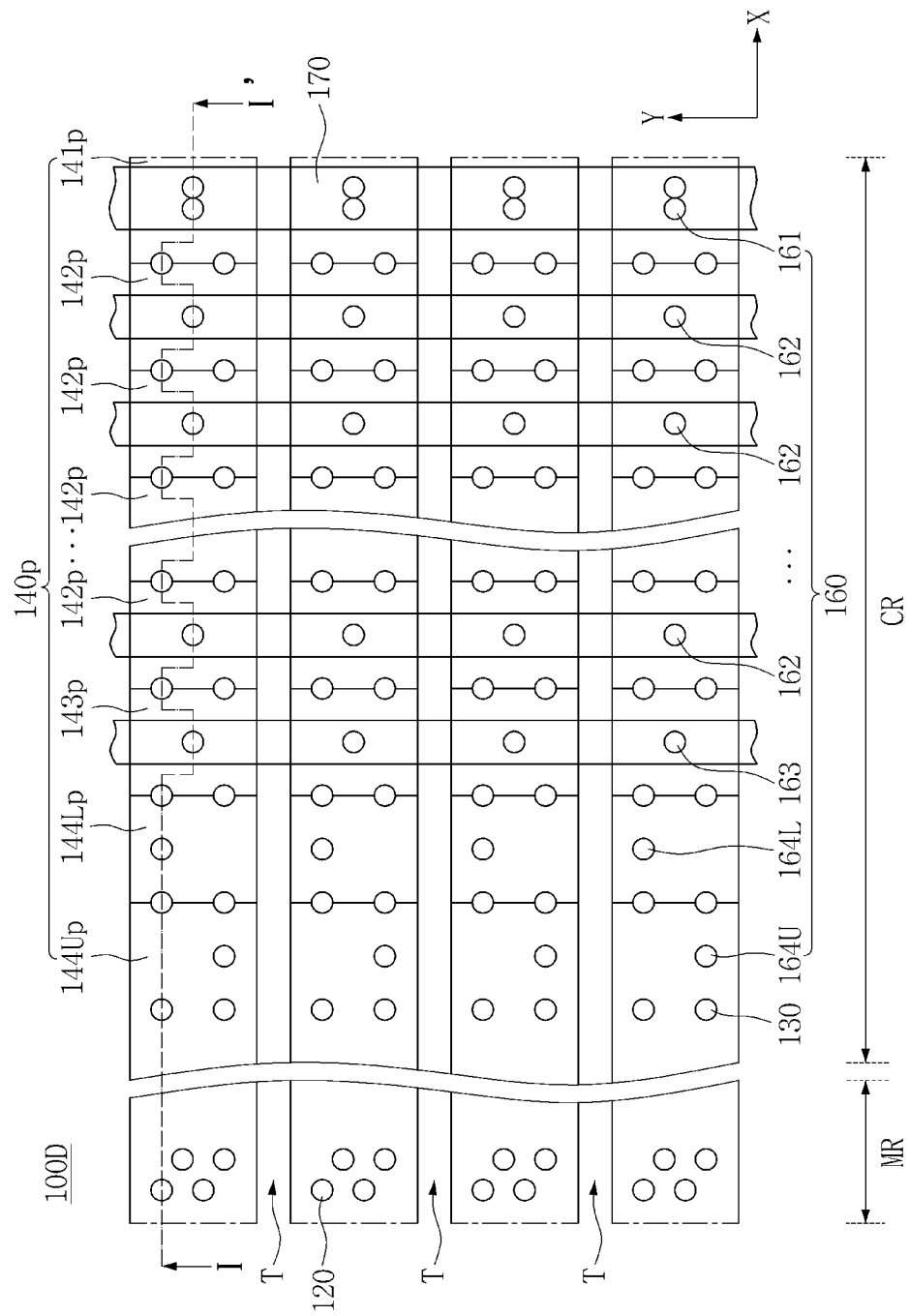

FIG. 4 is a layout illustrating a vertical NAND flash memory device according to example embodiments of the inventive concept. In the embodiment of the inventive concept, detailed descriptions of the same contents as those of the above-described embodiments will be omitted.

Referring to FIG. 4, a vertical NAND flash memory device 100D in accordance with the embodiment of the inventive concept may include a ground select contact plug 161 having a peanut shape in a plan view, compared to the vertical NAND flash memory device 100A in FIG. 1A. For example, the ground select contact plug 161 may have a shape in that two circles are connected to each other in the X-direction in a plan view. Each circle may have a width of the X-direction and a width of Y-direction that are the same. A cross-sectional view taken along line I-I' of FIG. 4 may be the same as FIG. 2B.

FIGS. 5 to 13, 14A and 14B are cross-sectional views taken along line I-I' of FIG. 1A for describing methods of fabricating a vertical NAND flash memory device according to example embodiments of the inventive concepts.

Figure 5:
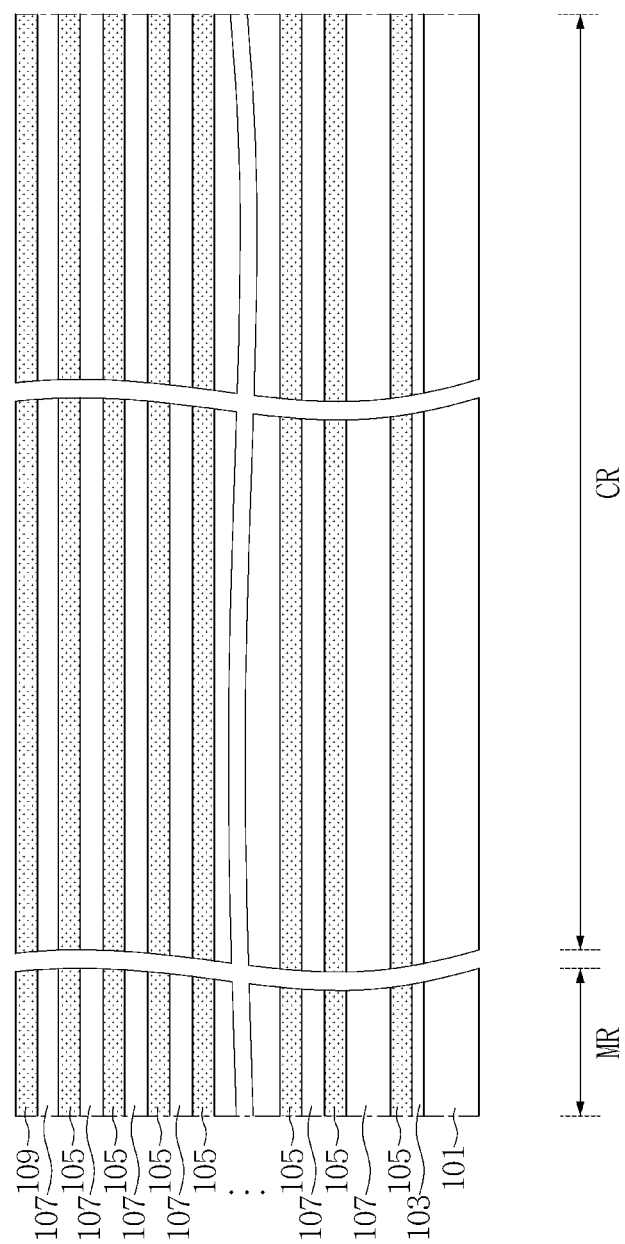
FIGS. 5 to 13, 14A and 14B are views for describing methods of fabricating a vertical NAND flash memory device according to example embodiments of the inventive concepts.

Referring to FIG. 5, a method of fabricating the vertical NAND flash memory device in accordance with the embodiment of the inventive concept may include preparing a substrate 101 including a memory cell region MR and a contact connection region CR, forming a buffer insulating layer 103 on the substrate 101, alternately forming a sacrificial insulating layers 105 and an interlayer insulating layers 107 on the buffer insulating layer 103, and a polishing stop layer 109 on a uppermost interlayer insulating layer 107.

The substrate 101 may include, for example, a silicon wafer, an epitaxial growth SiGe wafer, or a SOI wafer. A vertical thickness of the buffer insulating layer 103 may be smaller than vertical thicknesses of the interlayer insulating layers 107. A vertical thickness of a lowermost interlayer insulating layer 107 of the interlayer insulating layers 107 may be greater than vertical thicknesses of the other interlayer insulating layers 107. The buffer insulating layer 103 and the interlayer insulating layers 107 may include, for example, silicon oxide.

The sacrificial insulating layers 105 and the polishing stop layer 109 may include a material having an etch selectivity with respect to the buffer insulating layer 103 and the interlayer insulating layers 107. For example, the sacrificial insulating layers 105 and the polishing stop layer 109 may include, for example, silicon nitride.

Figure 6:
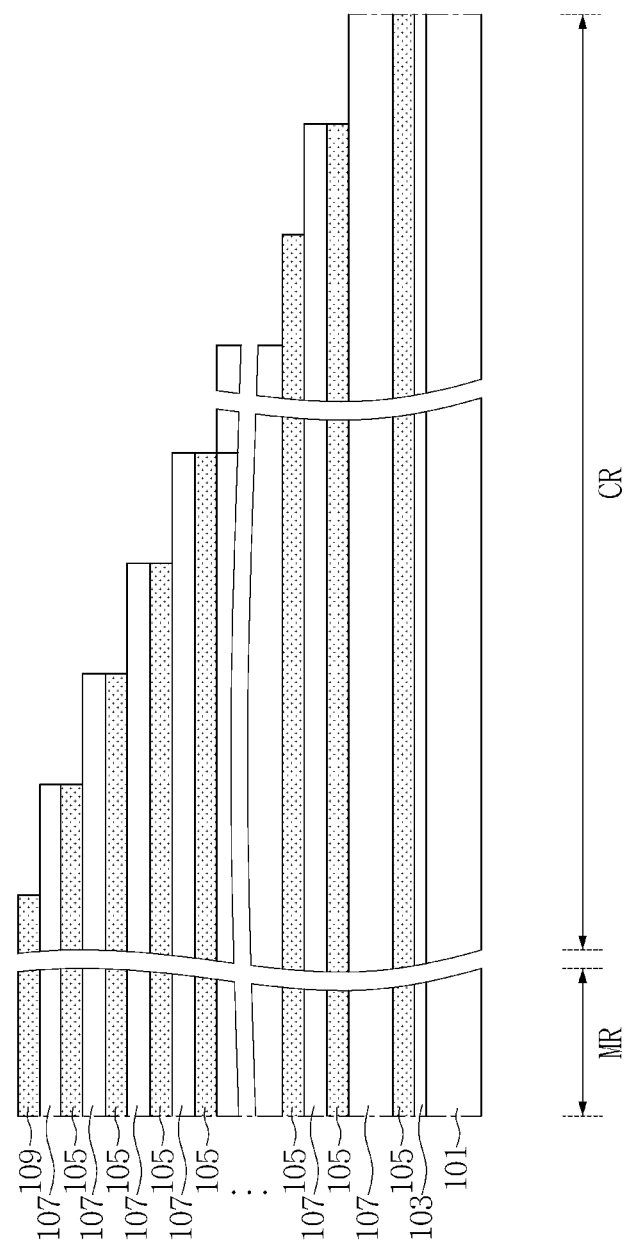

Referring to FIG. 6, the method may include forming a cascade structure by patterning the polishing stop layer 109, the interlayer insulating layers 107, and the sacrificial insulating layers 105 in the contact connection region CR. The cascade structure may be implemented by patterning and etching the polishing stop layer 109, the interlayer insulating layers 107, and the sacrificial insulating layers 105 several times. Due to the forming of the cascade structure, portions of the interlayer insulating layers 107 may be exposed.

Figure 7:
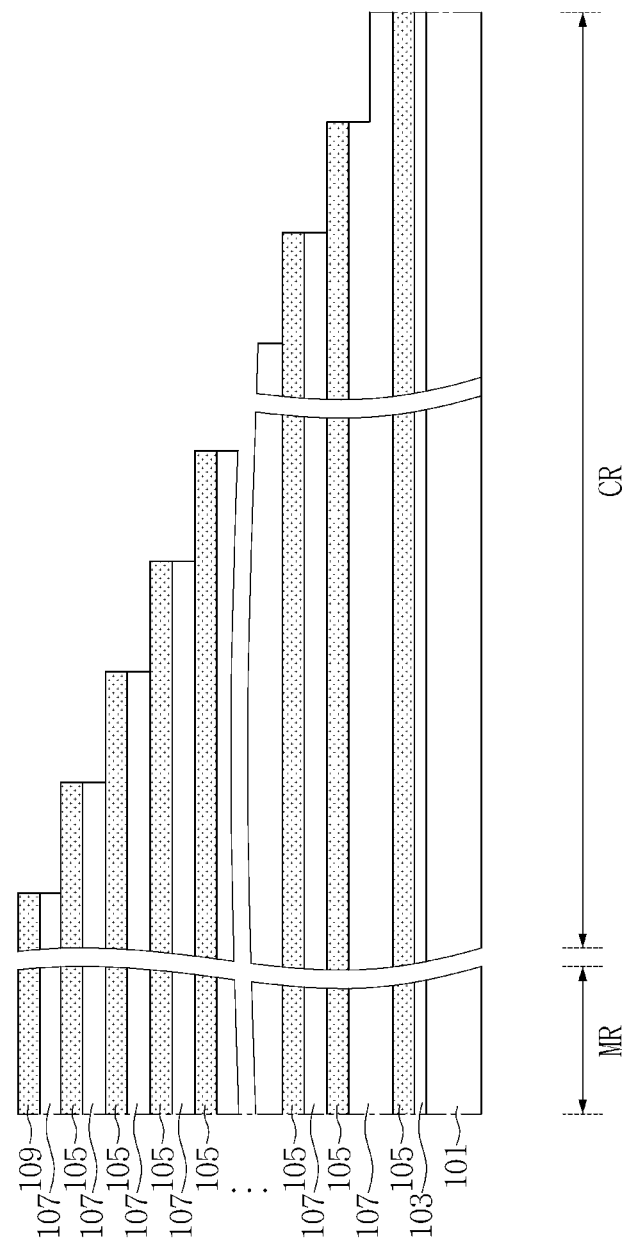

Referring to FIG. 7, the method may include exposing the sacrificial insulating layer 105 by removing the exposed interlayer insulating layers 107 by performing an etching process. The etching process may be performed by using the patterned polishing stop layer 109 as an etch mask, and the sacrificial insulating layers 105 as an etch stop layer. As described above, since the vertical thickness of the lowermost interlayer insulating layer 107 is greater than vertical thicknesses of the other interlayer insulating layers 107, the lowermost interlayer insulating layer 107 is partially etched, and thus a surface of a portion of a lowermost sacrificial insulating layer 105 of the sacrificial insulating layers 105 may be not exposed.

Figure 8:
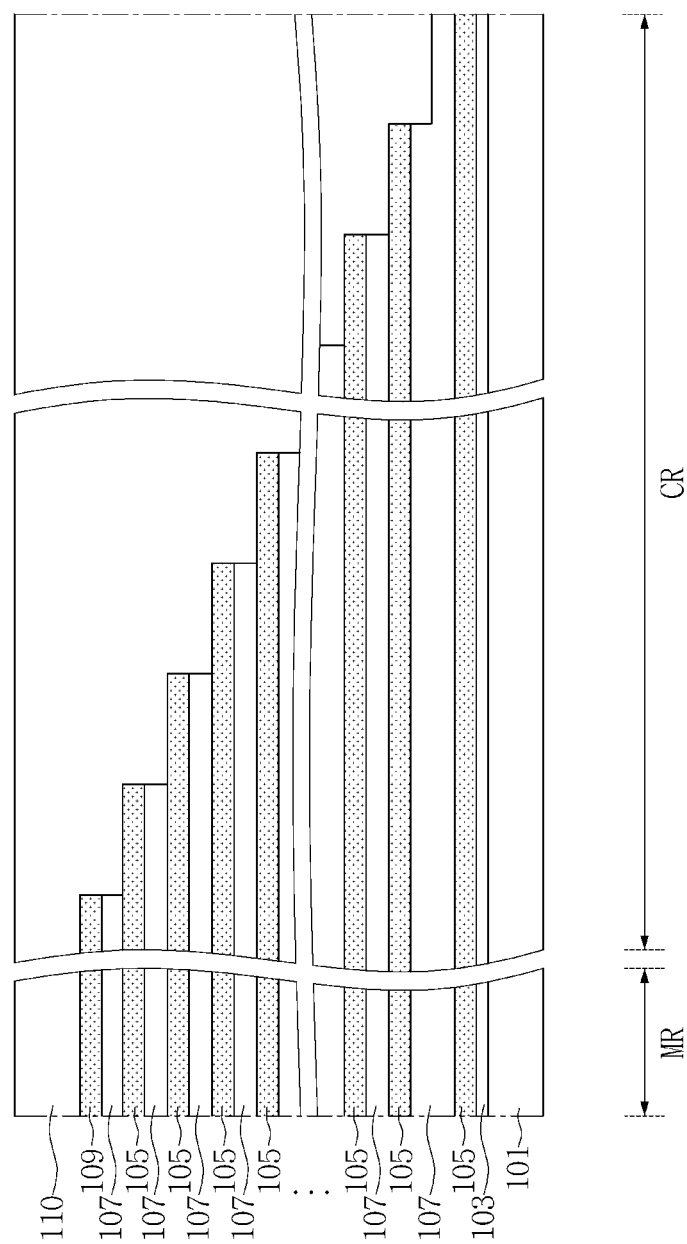

Referring to FIG. 8, the method may include forming a filling insulating layer 110 configured to cover the polishing stop layer 109 of the memory cell region MR and the cascade structure of the contact connection region CR. The filling insulating layer 110 may include a material having an etch selectivity with respect to the polishing stop layer 109. For example, the filling insulating layer 110 may include at least one of HDP oxide, TEOS, PE-TEOS, $O_3$-TEOS, USG, PSG, BSG, BPSG, FSG, SOG, TOSZ, or a combination thereof.

Figure 9:
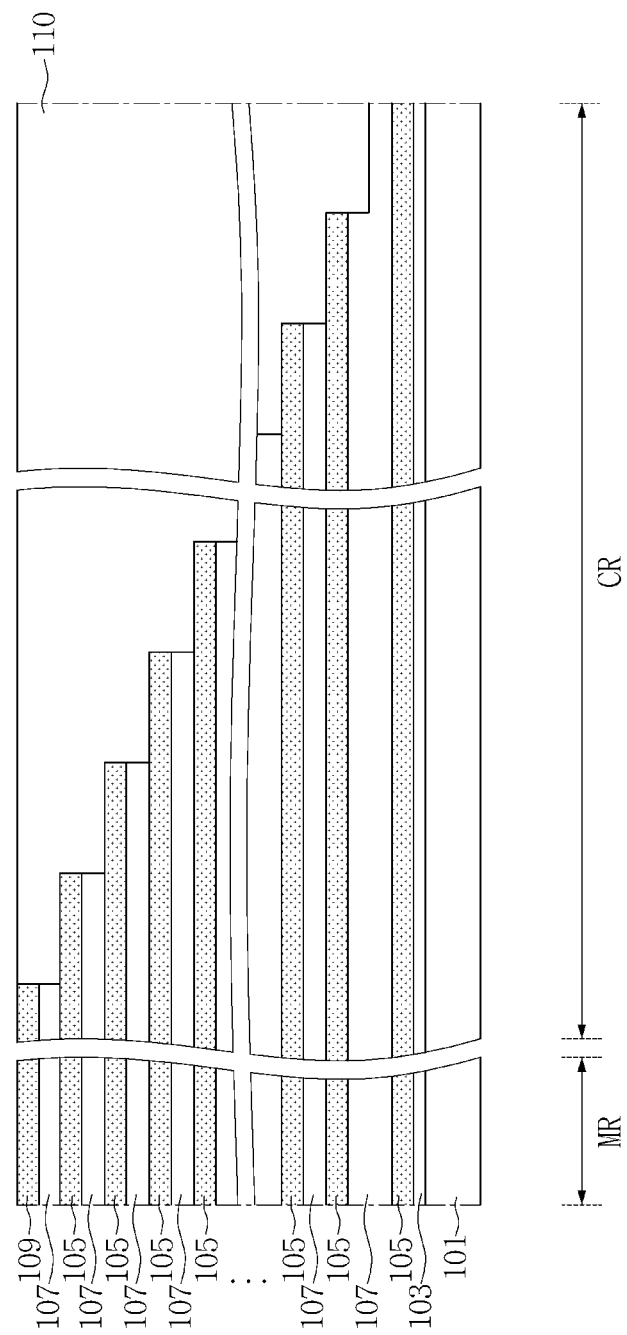

Referring to FIG. 9, the method may include planarizing the filling insulating layer 110 by performing a planarization process. The planarization process may include a chemical mechanical polishing (CMP) process. The planarization process may be performed by using the polishing stop layer 109 as an etching stop layer. Accordingly, an upper surface of the polishing stop layer 109 may be exposed. The upper surface of the polishing stop layer 109 may be substantially coplanar with an upper surface of the filling insulating layer 110.

Figure 10:
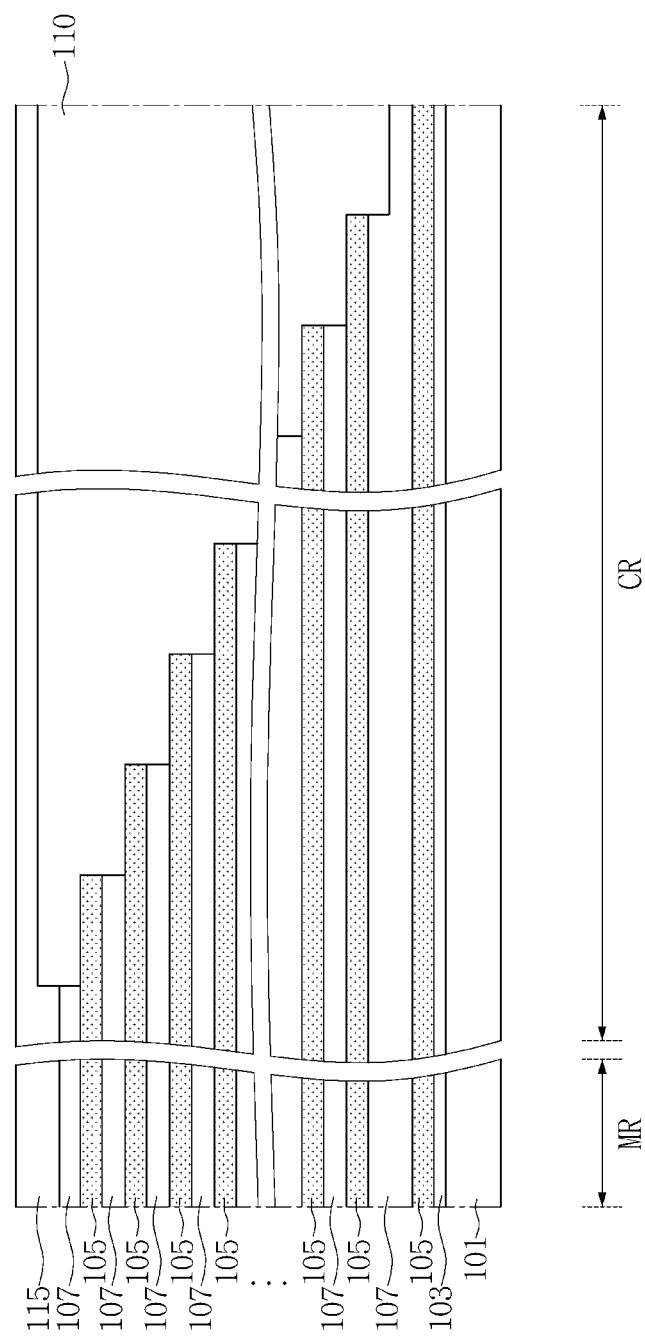

Referring to FIG. 10, the method may include removing the exposed polishing stop layer 109, and entirely forming a first upper interlayer insulating layer 115. Due to the forming of the first upper interlayer insulating layer 115 after removing the polishing stop layer 109, a vertical thickness of the first upper interlayer insulating layer 115 on the uppermost interlayer insulating layer 107 may be greater than a vertical thickness of the first upper interlayer insulating layer 115 on the filling insulating layer 110. The first upper interlayer insulating layer 115 may include at least one of HDP oxide, TEOS, PE-TEOS, $O_3$-TEOS, USG, PSG, BSG, BPSG, FSG, SOG, TOSZ, or a combination thereof.

Figure 11:
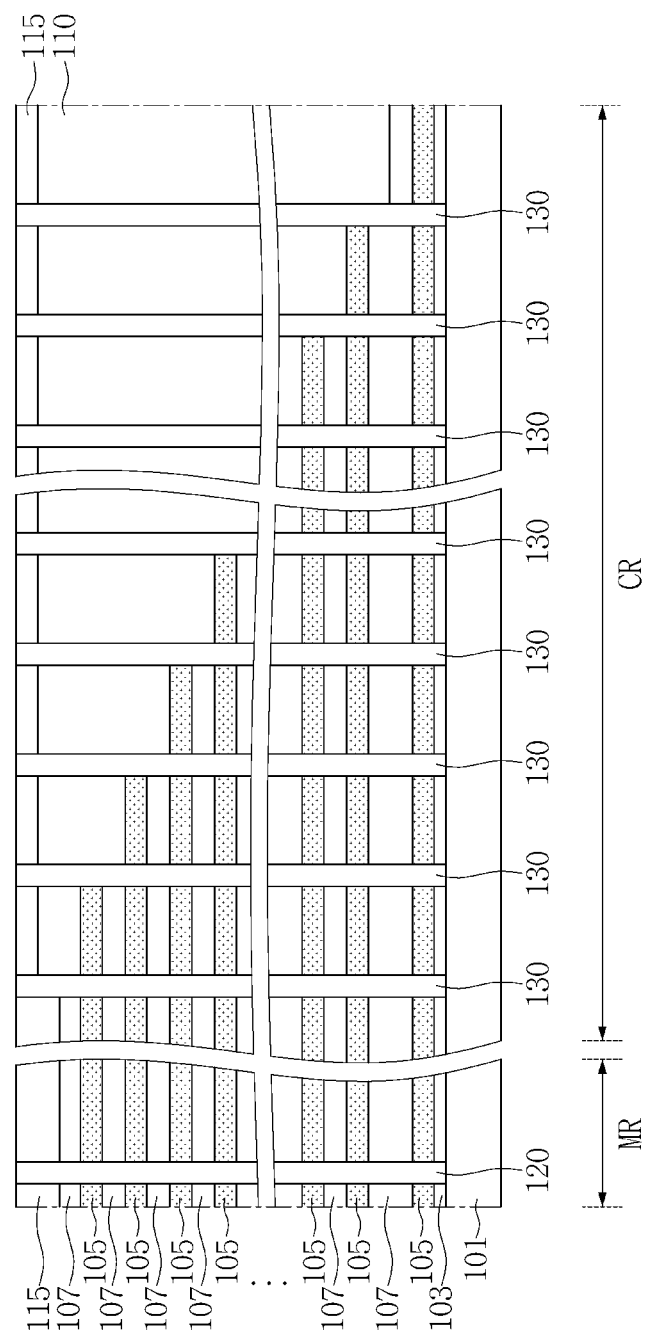

Referring to FIG. 11, the method may include forming vertical channel structures 120 and dummy pillars 130 configured to be in contact with the substrate 101 by vertically passing through the first upper interlayer insulating layer 115, the filling insulating layer 110, the interlayer insulating layers 107, the sacrificial insulating layers 105, and the buffer insulating layer 103. The vertical channel structures 102 may be formed in the memory cell regions MR, and the dummy pillars 130 may be formed in the contact connection regions CR. The forming of the vertical channel structures 120 and the dummy pillars 130 may include simultaneously forming channel holes and dummy holes that vertically pass through the first upper interlayer insulating layer 115, the filling insulating layer 110, the interlayer insulating layers 107, the sacrificial insulating layers 105, and the buffer insulating layer 103 in the memory cell region MR and the contact connection regions CR, and simultaneously forming the vertical channel structures 120 and the dummy pillars 130 in the channel holes and the dummy holes.

In example embodiments, the vertical channel structures 120 and the dummy pillars 130 may have substantially the same structure. For example, the vertical channel structures 120 and the dummy pillars 130 may have a structure shown in FIG. 1C. In example embodiments, the dummy pillars 130 may have a structure different from a structure of the vertical channel structures 120. For example, the dummy pillars 130 may include only silicon oxide.

For example, the vertical channel structure 120 may include string select transistors connected to the string select lines 144, each of cell transistors connected to respective cell gate lines 142, and ground select transistor connected to the ground select line 141. The string select transistors, the cell transistors, and the ground select transistor may be connected to each other in series and may constitute a NAND string cell of the NAND flash memory device.

Referring to FIG. 1A, the vertical channel structures 120 may be disposed in a zigzag shape in a plan view. Further, the dummy pillars 130 may be formed to pass through boundaries between adjacent the sacrificial insulating layers 105.

Figure 12:
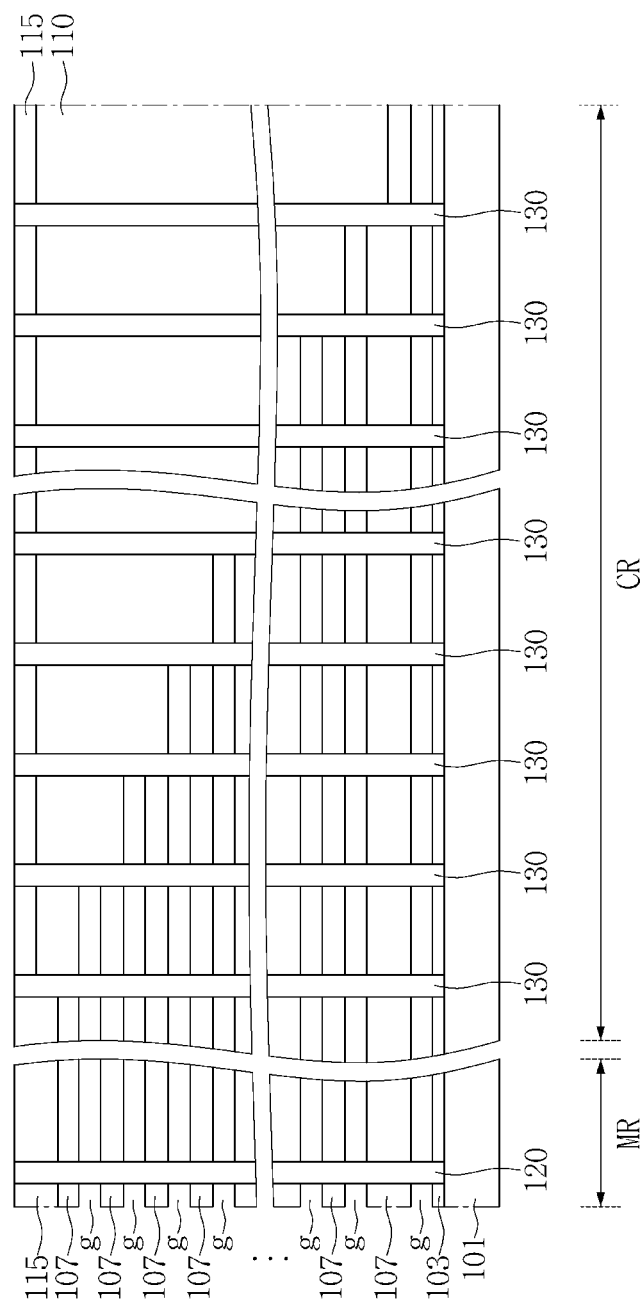

Referring to FIG. 12, the method may include forming gaps g by removing the sacrificial insulating layers 105. Referring to FIG. 1A, the forming of the gaps g may include exposing side surfaces of the sacrificial insulating layers 105 by forming trenches T by patterning the first upper interlayer insulating layer 115, the interlayer insulating layers 107, the sacrificial insulating layers 105, and the buffer insulating layer 103, and removing the sacrificial insulating layer 105 that side surfaces of the sacrificial insulating layer 105 are exposed through the trenches T using an etchant having an etch selectivity with respect to the first upper interlayer insulating layer 115, the interlayer insulating layers 107, the filling insulating layer 110, and the buffer insulating layer 103. The gaps g may horizontally extend between the interlayer insulating layers 107, and thus sidewalls of the vertical channel structures 120 and sidewalls of the dummy pillars 130 may be partially exposed.

Figure 13:
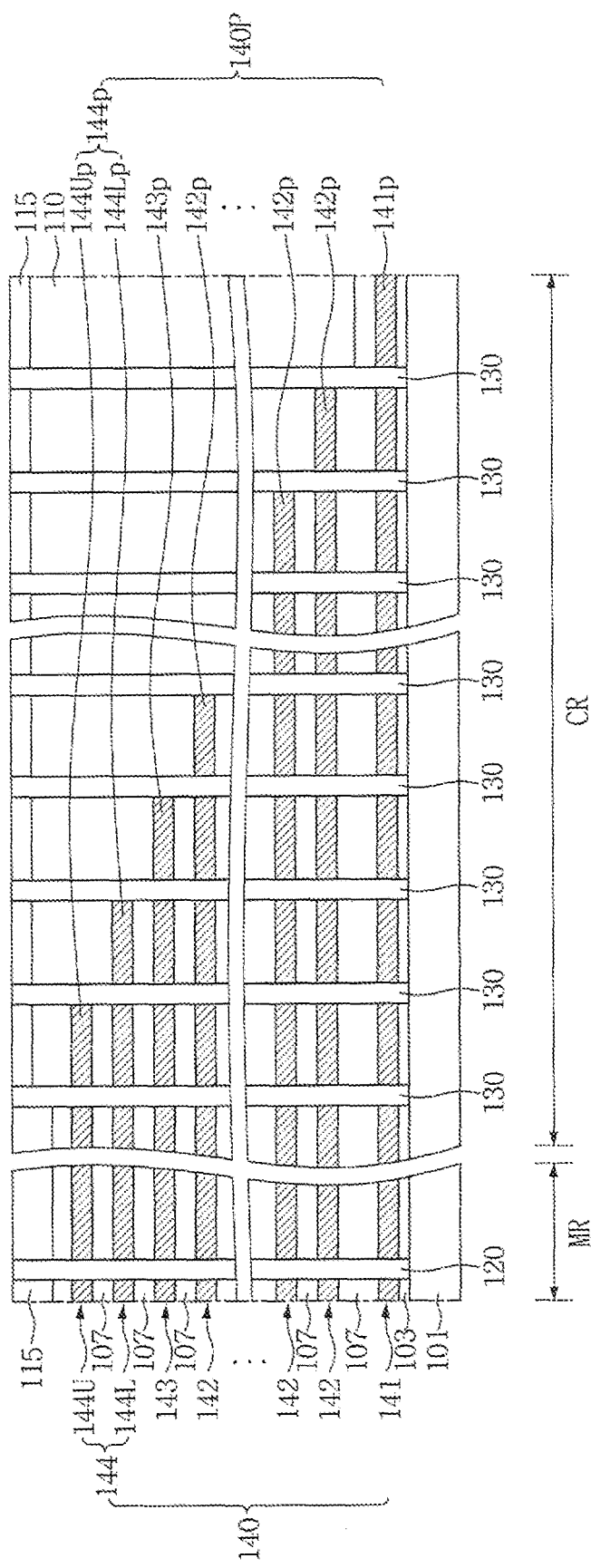

Referring to FIG. 13, the method may include forming word lines 140 and pads 140p which fill the gaps g. The forming of the word lines 140 and the pads 140p may include forming a conductive layer filling the gaps g by performing a deposition process, and removing the conductive layer formed on other portions except for insides of the gaps g by performing an etching process. The word lines 140 and the pads 140p may be materially in continuity with each other.

The word lines 140 may include a lowermost ground select line 141 that is the closest to the substrate 101, intermediate cell gate lines 142 disposed above the ground select line 141, a dummy word line 143 disposed above the uppermost cell gate line 142, and string select lines 144 disposed above the dummy word line 143. The string select lines 144 may include a lower string select line 144L and an upper string select line 144U.

The pads 140p may include a lowermost ground select pad 141p that is the closest to the substrate 101, cell gate pads 142p disposed above the ground select pad 141p, a dummy pad 143p disposed above the cell gate pads 142p, and string select pads 144p disposed above the dummy pad 143p. The string select pads 144p may include a lower string select pad 144Lp disposed above the dummy pad 143p, and an upper string select pad 144Up disposed above the lower string select pad 144Lp. Surfaces of the cell gate pads 142p, the dummy pad 143p, and the string select pads 144p may be in contact with the filling insulating layer 110, and a surface of the lowermost ground select pad 141p may be in contact with the lowermost interlayer insulating layer 107.

After forming the word lines 140 and the pads 140p, the method may further include forming common source areas in the substrate 101 by performing an ion implantation process, forming spacers configured to cover side surfaces of the word lines 140, filling insides of the trenches T, and forming common source lines connected to the common source areas.

Figure 14A:
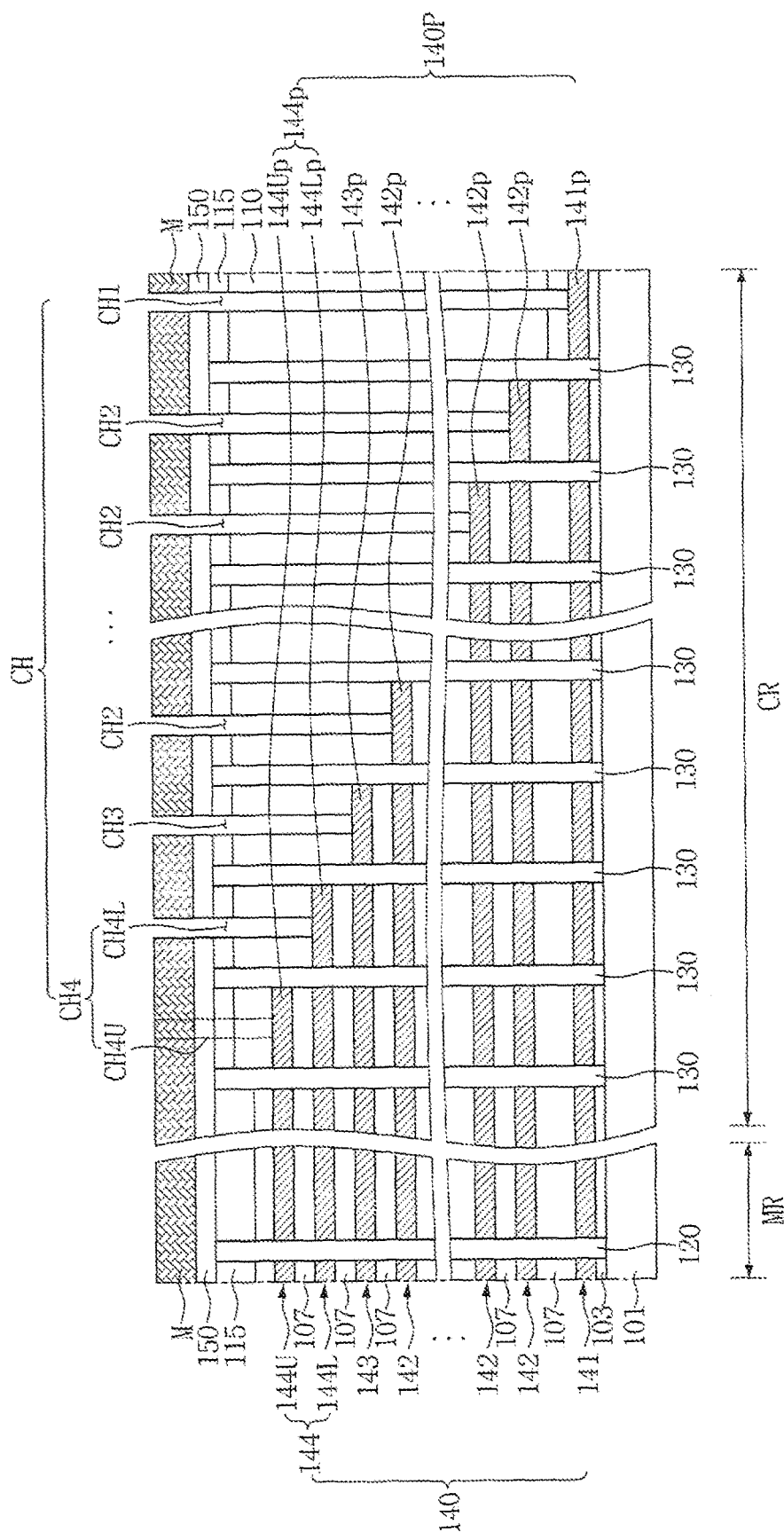

Referring to FIG. 14a, the method may include forming contact holes CH exposing upper surfaces of the pads 140p by performing an etching process. The forming of the contact holes CH may include forming a second upper interlayer insulating layer 150 on the first upper interlayer insulating layer 115, forming a photomask M on the second upper interlayer insulating layer 150, and patterning the second upper interlayer insulating layer 150, the first upper interlayer insulating layer 115, the filling insulating layer 110, and the lowermost interlayer insulating layer 107 by performing an etching process using the photomask M as an etch mask.

The contact holes CH may include a first contact hole CH1, second contact holes CH2, a third contact hole CH3, and fourth contact holes CH4. The fourth contact holes CH4 may include a lower fourth contact hole CH4L and an upper fourth contact hole CH4U. The first contact hole CH1 may be formed on the ground select pad 141p to expose a surface of the ground select pad 141p. The second contact holes CH2 may be formed on the cell gate pads 142p to expose surfaces of the cell gate pads 142p. The third contact holes CH3 may be formed on the dummy pad 143p to expose a surface of the dummy pad 143p. The lower fourth contact hole CH4L may be formed on the lower string select pad 144Lp to expose a surface of the lower string select pad 144Lp. The upper fourth contact hole CH4U may be formed on the upper string select pad 144Up to expose a surface of the upper string select pad 144Up.

A distance c2 between the first contact hole CH1 and the second contact hole CH2 that is adjacent to the first contact hole CH1 may be greater than distances c1 between the adjacent second contact holes CH2. For example, referring to FIG. 1A, the first contact hole CH1 may be formed at a position spaced apart from the adjacent second contact hole CH2 by c2 greater than by c1 in the X-direction.

Referring again to FIGS. 1A and 1B, the method may include forming contact plugs 160 filling the contact holes CH, forming I/O metal lines 170 configured to be in contact and aligned with portions of the contact plugs 160, and forming a third upper interlayer insulating layer 180 on the second upper interlayer insulating layer 150 to cover the I/O metal lines 170.

The contact plugs 160 may include a ground select contact plug 161, cell gate contact plugs 162, a dummy contact plug 163, and string select contact plugs 164. The string select contact plugs 164 may include a lower string select contact plug 164L, and an upper string select contact plug 164U. The I/O metal lines 170 may be formed on the ground select contact plug 161, the cell gate contact plugs 162, and the dummy contact plug 163.

Figure 14B:
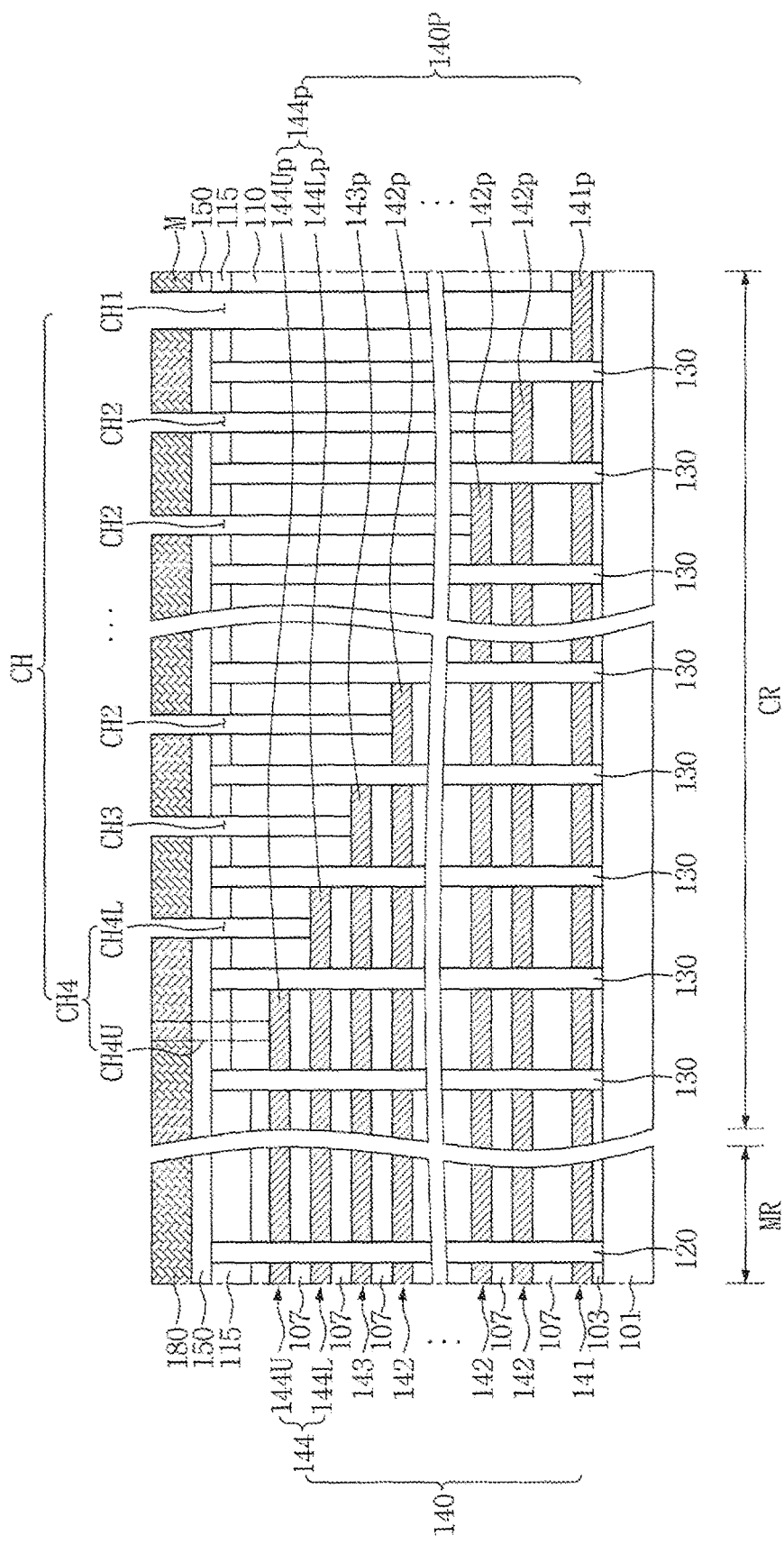

In example embodiments, referring to FIG. 14B, the method may include forming contact holes CH exposing upper surfaces of the pads 140p by performing an etching process. The contact holes CH may include a first contact hole CH1 exposing the surface of the ground select pad 141p, second contact holes CH2 exposing surfaces of the cell gate pads 142p, a third contact hole CH3 exposing a surface of the dummy pad 143p, and fourth contact holes CH4 exposing surfaces of the string select pads 144p. A horizontal width of the first contact hole CH1 may be greater than each of horizontal widths of the second contact holes CH2, the third contact hole CH3, and the fourth contact holes CH4.

Referring again to FIGS. 2A and 2B, the method may include forming contact plugs 160 filling the contact holes CH, forming I/O metal lines 170 configured to be in contact and aligned with the ground select contact plug 161, the cell gate contact plugs 162, and the dummy contact plug 163 of the contact plugs 160, and forming a third upper interlayer insulating layer 180 on the second upper interlayer insulating layer 150 to cover the I/O metal lines 170.

Figure 15:
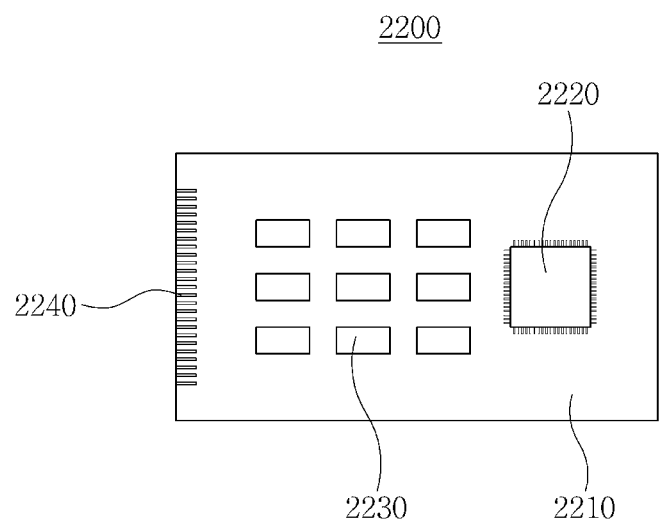
FIG. 15 is a diagram conceptually showing a semiconductor module according to certain embodiments of the inventive concept.

FIG. 15 is a diagram conceptually showing a semiconductor module 2200 in accordance with certain embodiments of the inventive concept. Referring to FIG. 15, the semiconductor module 2200 in accordance with the embodiment of the inventive concept may include a processor 2220 and semiconductor devices 2230 mounted on a module substrate 2210. The processor 2220 or the semiconductor devices 2230 may include at least one of the vertical NAND flash memory devices according to the disclosed embodiments. Conductive I/O terminals 2240 may be disposed on at least one side of the module substrate 2210.

Figure 16:
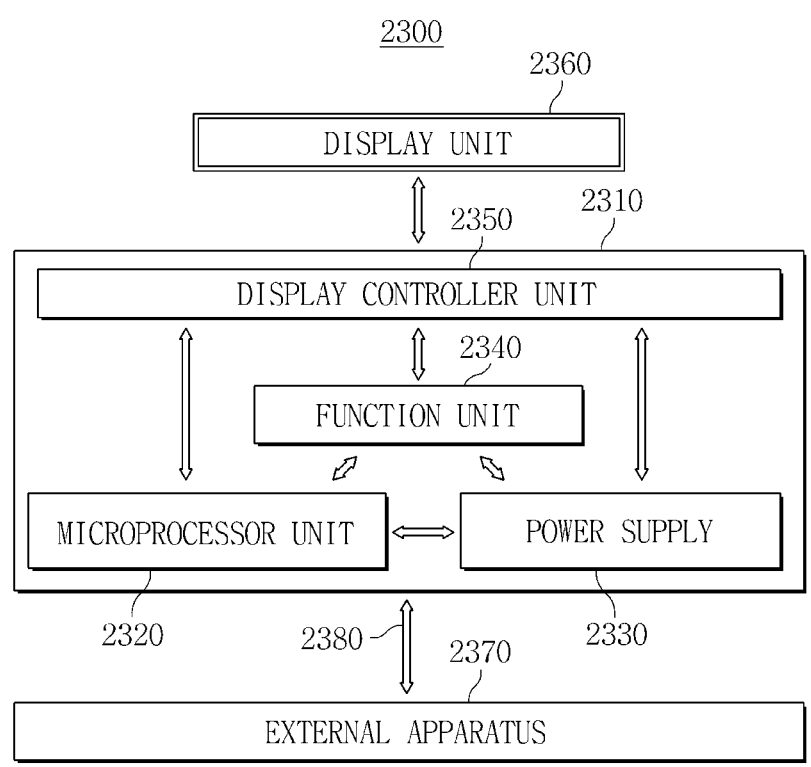
FIGS. 16 and 17 are block diagrams conceptually showing electronic systems according to certain embodiments of the inventive concept.

FIG. 16 is a block diagram conceptually showing an electronic system 2300 in accordance with certain embodiments of the inventive concept. Referring to FIG. 16, the electronic system 2300 in accordance with the embodiment of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a printed circuit board (PCB) and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMO-LED), or various display panels. The display unit 2360 may include a touch screen. Accordingly, the display unit 2360 may include an I/O function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include at least one of the vertical NAND flash memory devices according to the disclosed embodiments.

Figure 17:
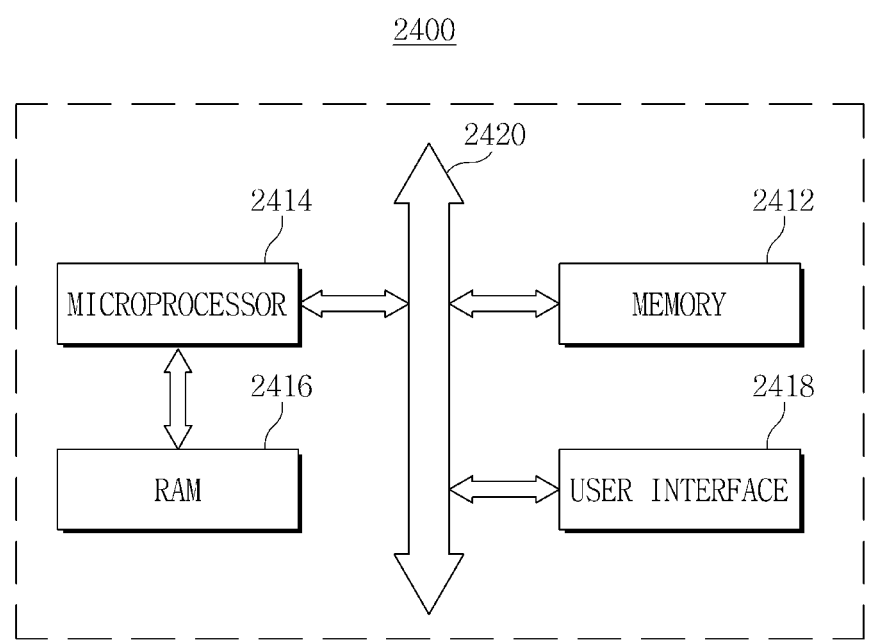

Referring to FIG. 17, an electronic system 2400 in accordance with certain embodiments of the inventive concept may include a microprocessor 2414, a memory 2412, and a user interface 2418, which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other I/O devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the vertical NAND flash memory devices according to the disclosed embodiments.

In the vertical NAND flash memory device according to the disclosed embodiments of the present disclosure, a distance between a ground select contact plug and a cell gate contact plug that is adjacent to the ground select contact plug in the X-direction may be greater than distances between the cell gate contact plugs in the same X-direction. As a result, a space margin between the ground select contact plug and a dummy pillar that is adjacent to the ground select contact plug may be improved.

Further, as a space margin between the ground select contact plug having the longest vertical length and a dummy pillar that is adjacent to the ground select contact plug is improved, when a not-open defect occurs in a process of forming the contact hole for forming the ground select contact plug, it is possible to easily perform an additional etching process.

Furthermore, an area of the ground select contact plug is increased by forming a cross section of the ground select contact plug in an elliptical shape or a peanut shape, and thus a situation where the not-open defect occurs in the process of forming the contact hole may be reduced.

Although a few embodiments have been described, those skilled in the art will readily appreciate that many modifications are possible without departing from the novel teachings and advantages. Accordingly, all such modifications are intended to be included within the scope of this invention as defined in the claims.

What is claimed is:

1. A vertical NAND flash memory device comprising:
   a substrate having a memory cell region and a contact connection region;
   word lines and interlayer insulating layers alternately and repeatedly formed on the substrate in the memory cell region;
   a plurality of pads disposed in the contact connection region and configured to extend from the word lines, wherein the plurality of pads have a cascade structure;
   a filling insulating layer formed on the substrate in the contact connection region to cover the plurality of pads;
   dummy pillars passing through the filling insulating layer and boundaries between the plurality of pads, and connected to the substrate; and
   contact plugs passing through the filling insulating layer and each contact plug connected to a corresponding pad of the plurality of pads,
   wherein the contact plugs include a first contact plug connected to a lowermost pad that is closest to the substrate, and a plurality of second contact plugs and each second contact plug connected to a corresponding pad of the plurality of pads,
   wherein a first distance between the first contact plug and a second contact plug of the plurality of second contact plugs that is adjacent to the first contact plug is greater than second distances between adjacent second contact plugs of the plurality of second contact plugs, and
   wherein a third distance between the first contact plug and a dummy pillar of the dummy pillars that is adjacent to the first contact plug is greater than each of fourth distances between each second contact plug of the plurality of second contact plugs and a corresponding dummy pillar of the dummy pillars that is adjacent to each second contact plug.

2. The vertical NAND flash memory device of claim 1, wherein the interlayer insulating layers extend into the contact connection region, and
   wherein the interlayer insulating layers that are located at the contact connection region have a cascade structure.

3. The vertical NAND flash memory device of claim 1, wherein horizontal lengths of the pads are greater as the pads are closer to the substrate.

4. A vertical NAND flash memory device comprising:
   a substrate having a first region and a second region;
   word lines and first insulating layers alternately stacked on the substrate in the first region;
   a plurality of pads disposed in the second region and each pad extending from a corresponding word line;
   a second insulating layer formed to cover the plurality of pads on the substrate in the second region;
   dummy pillars vertically passing through the second insulating layer and connected to the substrate;

a first contact plug passing through the second insulating layer and connected to a first pad of the plurality of pads that is closest to the substrate; and a set of second contact plugs passing through the second insulating layer and each second contact plug connected to a corresponding pad of the plurality of pads, wherein a first dummy pillar of the dummy pillars is disposed between the first contact plug and a second contact plug of the set of second contact plugs, wherein a first distance between the first contact plug and the first dummy pillar is greater than a second distance between the second contact plug and the first dummy pillar.

5. The memory device of claim 4, wherein each of distances between a contact plug of the second set of contact plugs and a corresponding dummy pillar of the dummy pillars is substantially the same.

6. The memory device of claim 4, wherein a type of shape of the first contact plug in a plan view is different from a type of shape of each of the second set of contact plugs in a plan view, and wherein the type of shape of each of the second set of contact plugs is substantially identical.

7. The memory device of claim 4, wherein a dummy pillar is disposed at a first side of the first contact plug and no dummy pillar is disposed at a second side of the first contact plug opposite to the first side.

8. The memory device of claim 4, further comprising:

a vertical channel structure formed in the first region and comprising a string select transistor, cell transistors, and a ground select transistor connected to each other in series, wherein the first contact plug is electrically connected to the ground select transistor.

9. The memory device of claim 4, wherein each of the dummy pillars vertically passes through the edge of a corresponding pad of the plurality of pads and contacts the edge of the corresponding pad.

10. A vertical NAND flash memory device comprising:

a substrate including a memory cell region and a contact connection region;

a first word line on the substrate, the first word line extending from the memory cell region to the contact connection region in a first direction;

a plurality of second word lines vertically stacked on the first word line to have a staircase structure;

a first contact plug connected to the first word line; and a plurality of second contact plugs connected to the second word lines, respectively, wherein the first contact plug has a first bottom surface contacting a top surface of the first word line, and the first bottom surface has a first width in the first direction, wherein each of the second contact plugs has a second bottom surface contacting a top surface of a corresponding second word line of the second word lines, and the second bottom surface has a second width in the first direction smaller than the first width, wherein the first contact plug is spaced apart from an end of the first word line by a first distance, wherein each of the second contact plugs is spaced apart from an end of a corresponding second word line of the second word lines by a second distance greater than the first distance, wherein the second widths corresponding to the second contact plugs are substantially the same as each other, and wherein the second distances corresponding to the second contact plugs are substantially the same as each other.

11. The vertical NAND flash memory device of claim 10, wherein the first bottom surface has a third width in a second direction perpendicular to the first direction, and wherein the second bottom surface has a fourth width in the second direction smaller than the third width.

12. The vertical NAND flash memory device of claim 10, further comprising a vertical channel on the memory cell region, the vertical channel passing through the plurality of the second word lines and the first word line.

13. The vertical NAND flash memory device of claim 10, further comprising dummy pillars on the contact connection region, the dummy pillars passing through sidewalls of the second word lines.

14. The vertical NAND flash memory device of claim 13, wherein the dummy pillars are connected to the substrate.

* * * * *